United States Patent
Kojima

(10) Patent No.: US 7,154,258 B2
(45) Date of Patent: Dec. 26, 2006

(54) IC TRANSFER DEVICE

(75) Inventor: Shinichi Kojima, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 103 days.

(21) Appl. No.: 10/507,854

(22) PCT Filed: Dec. 25, 2002

(86) PCT No.: PCT/JP02/13549

§ 371 (c)(1),
(2), (4) Date: Sep. 15, 2004

(87) PCT Pub. No.: WO2004/059332

PCT Pub. Date: Jul. 15, 2004

(65) Prior Publication Data

US 2005/0105351 A1    May 19, 2005

(51) Int. Cl.
*G01R 31/28* (2006.01)

(52) U.S. Cl. .................................................. 324/158.1

(58) Field of Classification Search ...................... None
See application file for complete search history.

(56) References Cited

U.S. PATENT DOCUMENTS 6,690,284 B1 *   2/2004   Ohno et al. .................. 340/679

FOREIGN PATENT DOCUMENTS

| JP | 7-55879   | 3/1995 |
| JP | 2001-51018 | 2/2001 |
| KR | 2001-85197 | 9/2001 |

* cited by examiner

*Primary Examiner*—Jermele Hollington
*Assistant Examiner*—Trung Q Nguyen
(74) *Attorney, Agent, or Firm*—Dickstein Shapiro LLP

(57) ABSTRACT

An IC transfer device is provided that can combat the generation of the cracks in handling the IC packages. When the hand 3 comes in contact with the IC package 4 accommodated on the tray 5, a load cell 6 comes in contact with a bottom surface of a base 10. Reference values as to a press-down amount and a press-down speed of the hand 3 are set in a setting section so as not to cause cracks in the IC package 4 due to the instantaneous load at the time of contact between the hand 3 and the IC package 4. In a transfer operation, when detecting the contact between the hand 3 and the IC package 4, a control section 20 controls a servomotor of the hand drive mechanism 22 so that the hand 3 operates according to the reference values set in the setting section.

12 Claims, 7 Drawing Sheets

IC TRANSFER DEVICE

This application is a national stage entry of PCT/JP02/13549 international Filing Date: Dec. 25, 2002.

1. Technical Field

The present invention generally relates to an IC transfer device that transfers an IC package such as a QFP (Quad Flat Package), a BGA (Ball Grid Package), a CSP (Chip Size Package), and a wafer-level CSP.

2. Background Art

In an electrical characteristic tester, a visual check machine, a burn-in tester and the like, the IC transfer device is used as a handler for picking and placing a target IC package in place or for displacing the IC package.

As shown in FIG. 1, the IC package 4 is accommodated in a tray 5 before being placed in the tester. The IC transfer device moves a hand 3 downward toward the IC package 4 to pick up the IC package 4 accommodated in the tray 5 and then transfers that IC package 4 to a predetermined place and then places it in the tester. A drive device for moving the hand 3 up or down is provided with the IC transfer device. For example, a drive mechanism, such as a servomotor for rotating a ball screw, is provided to raise or lower the hand 3 vertically. After the hand 3 comes in contact with the IC package 4, the bottom surface of the hand 3 (i.e., the surface that makes contact with the IC package 4) is further lowered by a predetermined amount so as to apply pressure to the IC package 4 and thereby chuck the IC package 4.

A typical procedure for setting the IC transfer device is as follows. As a first step, under conditions of the IC package 4 being on the tray 5, the height (stroke) of the hand 3 is adjusted appropriately so that the hand 3 can chuck the IC package 4. At this time, the height adjusted according to a setting for a thick-type QFP or BGA (about 3 mm thickness) transferred previously is often utilized. For the thick-type QFP or BGA, the hand 3 is further lowered after making contact with the top surface of the IC package 4 until the height of bottom surface of the hand 3 is about 2 mm lower than the top surface of the IC package 4 so as to ensure the chuck operation. This lowering of the hand 3 after making contact with the IC package 4 is referred to as "pressing down". Inadequate chuck-operation causes the IC package to drop from the hand 3 during a transferring process. For this reason, the "pressing down" is carried out.

As long as the IC transfer device can transfer the IC package without problems such as an chucking error, an error causing the device to stop, a deformation of a terminal of the IC package, and a deformation of the outside shape of the IC package, the IC transfer device is considered to be a device equipped with the capacity to transfer the IC package.

The lowering speed of the hand 3 when the hand 3 is lowered to pick up the IC package is a significant factor on which operating efficiency depends. With regard to the lowering speed, a number of IC transfer devices have been developed for an improved transferring speed to meet the needs in the age of the thick-type QFP or BGA. The recent-model IC transfer devices enable an index time for changing of the IC packages (i.e., the interval between each transferring of an IC package) to be less than 1 sec. Because a reduction of the lowering speed of the hand 3 results in a reduction of the operating efficiency, a manufacturer's suggested lowering speed has been commonly employed.

When the hand 3 moves downward toward the top surface of the IC package 4 and then further moves downward by a predetermined amount after it makes contact with the top surface, the impact on the IC package 4 is significant due to several factors such as weight of the hand 3, shape of the hand 3, contact area between them, and speed of the hand 3. The load exerted on the IC package 4 by the hand 3 can be divided into two types of load, that is to say, an impact load generated when the hand 3 comes in contact with the IC package 4, and a static load generated when the hand 3 is pressed down after making contact with the IC package 4. The combination of these two types of load is referred to as an instantaneous load.

Before this time, the instantaneous load has not been under control. However, if the instantaneous load is not taken into account in the use of the IC transfer device, significant quality problems will occur, such as cracks in a chip inside the IC package (hereafter referred to as chip cracks), and cracks visible from the outside of the IC package, in the case of a large instantaneous load. These problems are more likely to occur in the case of a thin-type IC package (less than 1 mm thickness).

To maintain quality means to make the IC package free from any chip cracks. However, the chip cracks inside the IC package cannot be detected by visual check or a visual inspection.

As the cracks show up as various forms of defects through the electrical characteristic test depending on their location, the cracks can be detected. However, the chip cracks include the minute cracks that cannot be visually detected. Unfortunately, there may be cases where the IC packages with the minute cracks are considered to meet pass criteria even by the electrical characteristic test. Accordingly, one cannot say with assuredness that all of the IC packages with the chip cracks are rejected as defective items through the electrical characteristic test.

By the way, the chip cracks generated by the electrical characteristic test process, as is the case with a prior and a subsequent process (i.e., a burn-in process or a visual check process), cannot be detected, unless an individual observation for every IC package is performed through use of a Scanning Acoustic Tomograph (SAT). However, the SAT is made use of only at the beginning of the development of the IC package for a certificate test for examining the presence or absence of an exfoliation inside the IC package, so the SAT cannot be made use of at a stage of volume production. Thus, there may be cases where the cracks inside the IC package or the minute cracks are overlooked at shipment and result in later problems.

DISCLOSURE OF THE INVENTION

It is a general object of the present invention to provide an IC transfer device that can avoid the generation of the cracks in the IC package during the handling of the IC package.

It is another object of the present invention to provide a method of controlling such an IC transfer device.

To achieve the object, according to one aspect of the invention, the IC transfer device comprises a hand for chucking an IC package on a tray; a hand drive mechanism for moving the hand downward toward the IC package; a control section for controlling the hand drive mechanism; a load cell which is arranged such as to come in contact with a component integrated with the hand when the hand comes in contact with the IC package, and measures load applied thereto by a lowering operation of the hand; and a setting section for setting reference value as to the lowering operation of the hand, wherein the control section is configured to control the hand drive mechanism based on the reference value while monitoring an output of the load cell.

With this arrangement, by monitoring a peak value of the production of the load cell, it becomes possible to manage an instantaneous load exerted instantaneously at impact on the IC package when the hand comes in contact with the IC package. Furthermore, by controlling the hand drive mechanism based on the reference value while continuously monitoring the instantaneous load, it becomes possible to transfer the IC package without producing the chip cracks therein. Consequently, it becomes possible to save time required to diagnose the low production yields of the IC package due to the chip cracks and guarantee high quality of the IC package after shipment.

Preferably, the reference value comprises a lowering speed of the hand when the hand comes in contact with the IC package. With this arrangement, it becomes possible to control the magnitude of an instantaneous load exerted instantaneously at impact on the IC package.

The reference value may comprise not only a lowering speed but also a press-down amount and a press-down speed itself of the hand after making contact with the IC package.

The irregularities in the lowering operation may be detected by determining whether the peak value of the load cell exceeds a predetermined threshold value or not.

Preferably, the lowering speed of the hand before making contact with the IC package is higher than that of the hand after making contact with the IC package. With this arrangement, the operating efficiency of the IC transfer device can be increased.

Preferably, the hand drive mechanism comprises a servomotor or a step motor. With this arrangement, it becomes possible to control the hand with a high degree of precision.

Preferably, the hand has an end face suitable for holding the IC package, for example, by means of vacuum suction. With this arrangement, it becomes possible to expand the applicability of the present invention to the traditional general purpose IC transfer device.

According to another aspect of the invention, a method of controlling IC transfer device comprises moving a hand downward toward the IC package on a tray; changing a lowering speed of the hand so that the hand comes in contact with the IC at a predetermined speed; monitoring an output of a load cell at the time the hand comes in contact with the IC package, said load cell arranged such as to come in contact with a component integrated with the hand when the hand comes in contact with the IC package.

BEST MODE FOR CARRYING OUT THE INVENTION

In the following, principles and embodiments of the present invention will be described with reference to the accompanying drawings.

Example reference values set in a setting section 24 consist of a press-down amount and a press-down speed during the time a hand moves down further and presses an IC package downward after making contact with the IC package. Another example of reference values set in the setting section 24 consists of the press-down amount during the hand moves down further and presses an IC package downward after making contact with the IC package, and an output of a load cell when the hand comes in contact with the IC package.

For the purpose of increased operating efficiency, a control section 22 preferably controls a hand drive mechanism 20 so that a lowering speed of the hand before making contact with the IC package is higher than the press-down speed after making contact with the IC package. In order to precisely control the press-down operation, the hand drive mechanism 20 for moving the hand vertically is preferably either a servomotor or a stepping motor. One example of the hand is the one that is provided with a mechanism suitable for holding the IC package to its end surface.

[Embodiment]

Figure 1:
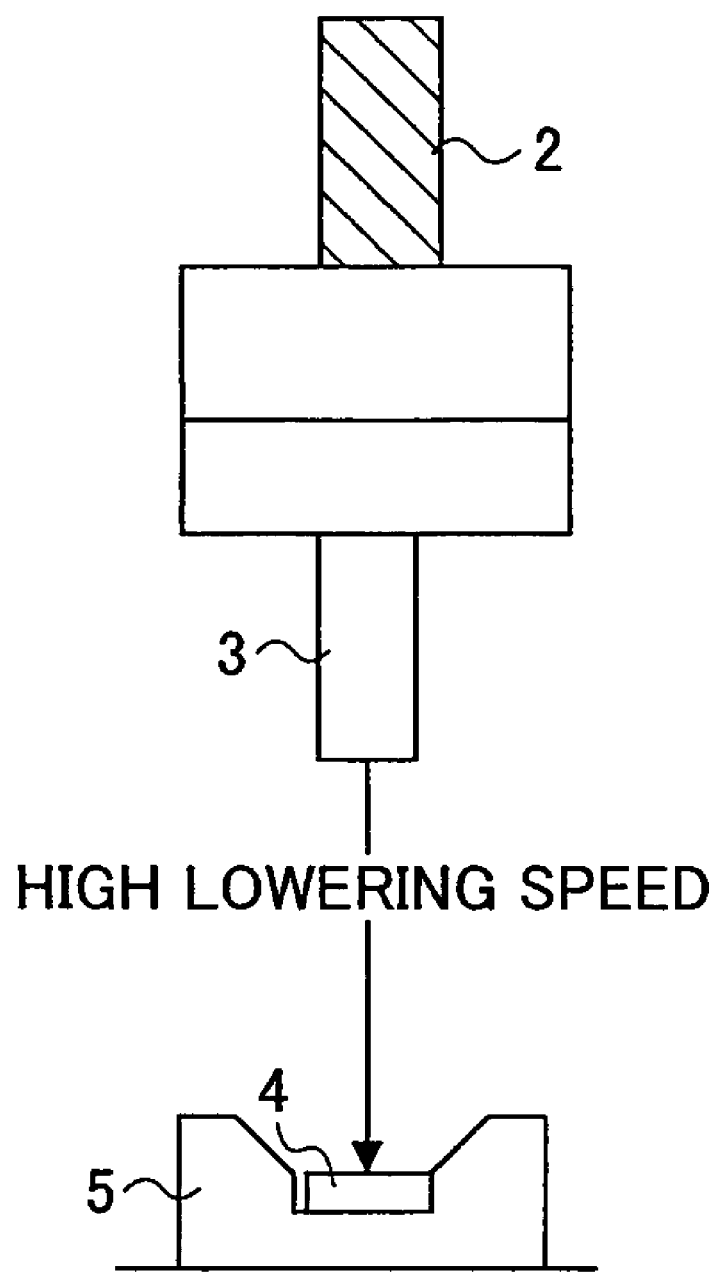
FIG. 1 is a front view of a IC transfer device according to prior art.
Figure 2:
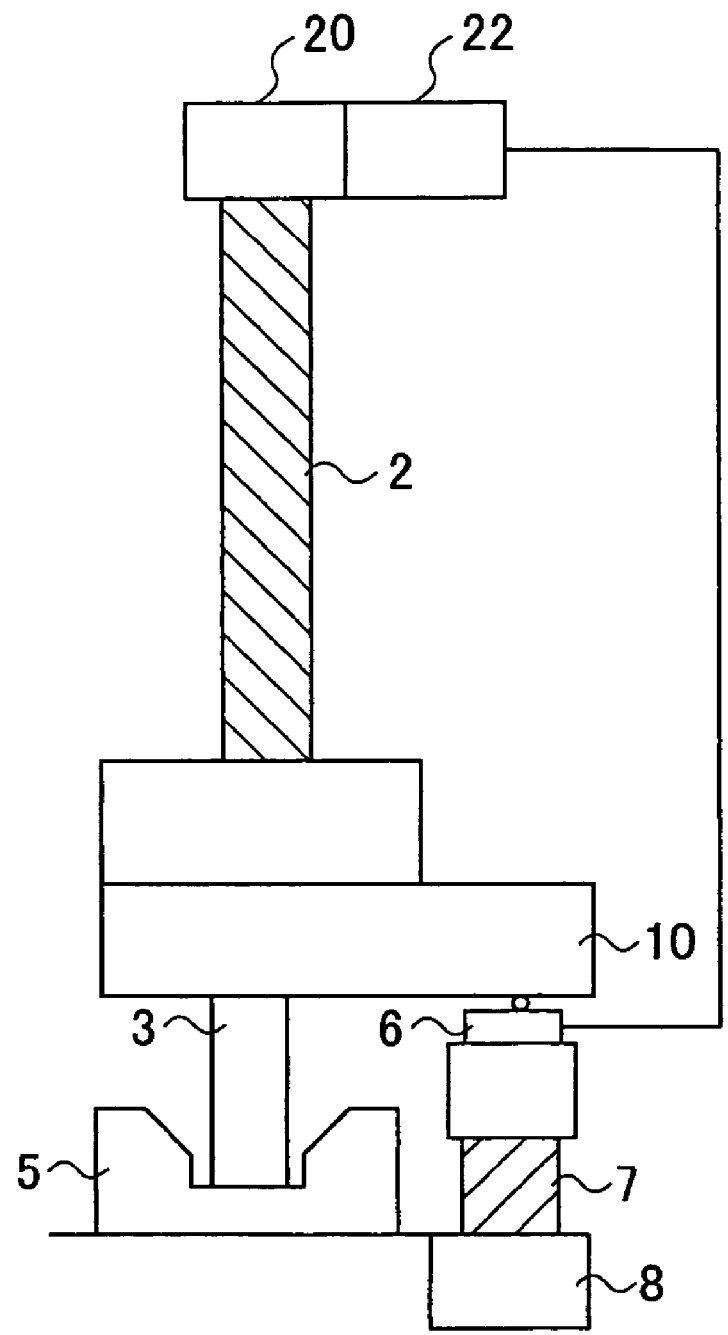
FIG. 2 is a front view of a IC transfer device in a calibration mode.
Figure 3:
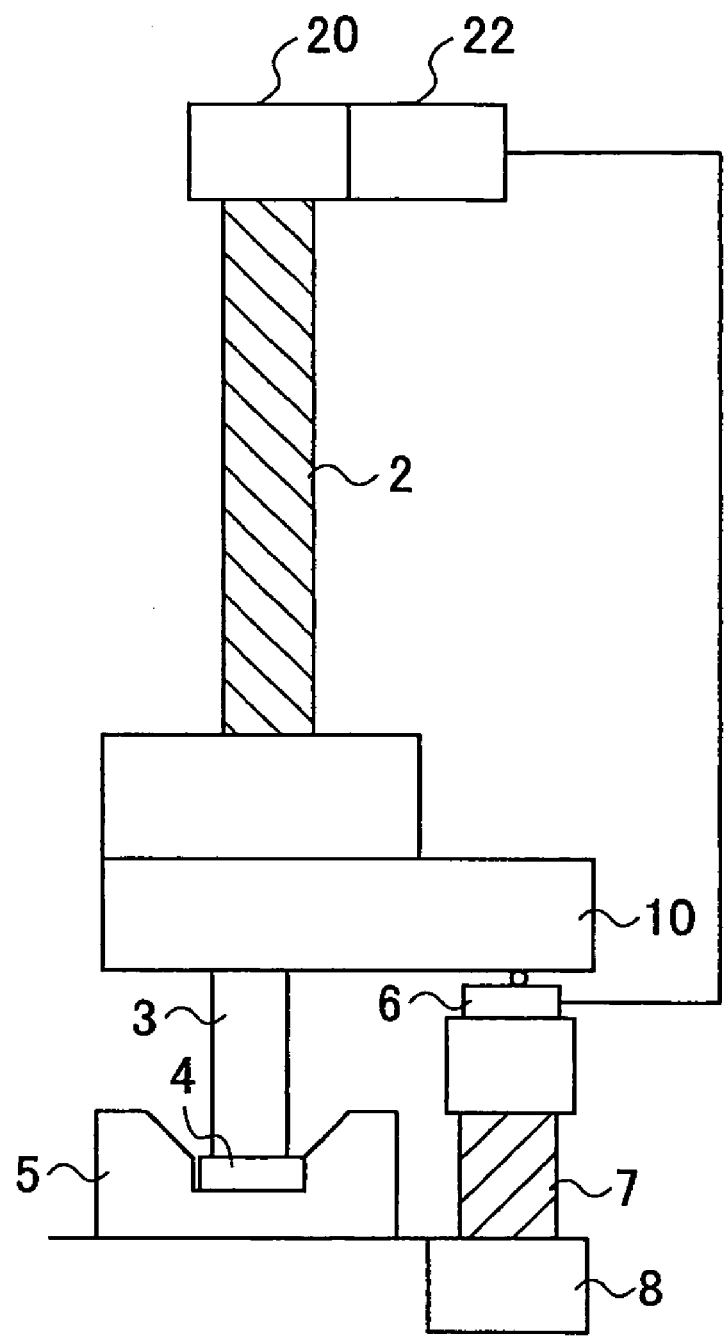
FIG. 3 is a front view of a IC transfer device in an IC package-transfer mode.

FIGS. 2 and 3 show one embodiment of the present invention. FIG. 2 illustrates an IC transfer device in a state of performing a calibration, and FIG. 3 illustrates the IC transfer device in a state of transferring an IC package. In order to raise or lower a hand 3 vertically, a base 10 on which the hand 3 is mounted is provided at the bottom of a ball screw 2, and a servomotor of the hand drive mechanism 20 for rotating the ball screw 2 is provided. The ball screw 2 is rotatablely attached to the base 10. When the ball screw 2 is rotated by the hand drive mechanism 20, the up-and-down movement of the ball screw 2 causes the up-and-down movement of the base 10 without causing a rotary movement of the base 10. The hand 3 has an end face suitable for holding the IC package 4 by means of vacuum suction and chucking it thereto.

The IC package 4 is accommodated on a tray 5, such as a shuttle, a stage, a socket and a receptacle, from which the IC package 4 is transferred to a tester or other desired places. As shown in FIG. 2, a load cell 6 is provided to the position where it comes in contact with the bottom surface of the base 10 when the end face of the hand 3, such as a transfer hand, a collet, and a contactor, comes in contact with the tray 5. Alternately, as shown in FIG. 3, the load cell 6 is provided to the position where it comes in contact with the bottom surface of the base 10 when the end face of the hand 3 comes in contact with the IC package 4 accommodated on the tray 5. Although the base 10 is relatively large in size so as to facilitate the contact between the base 10 and the load cell 6, the base 10 is not necessarily larger in size than a traditional base as far as it is capable of making contact with the load cell 6. In order to make the height of the load cell 6 adjustable, the load cell 6 is secured to the top end of the ball screw 7 whose height is adjustable by a drive mechanism 8 such as a servomotor.

Figure 4:
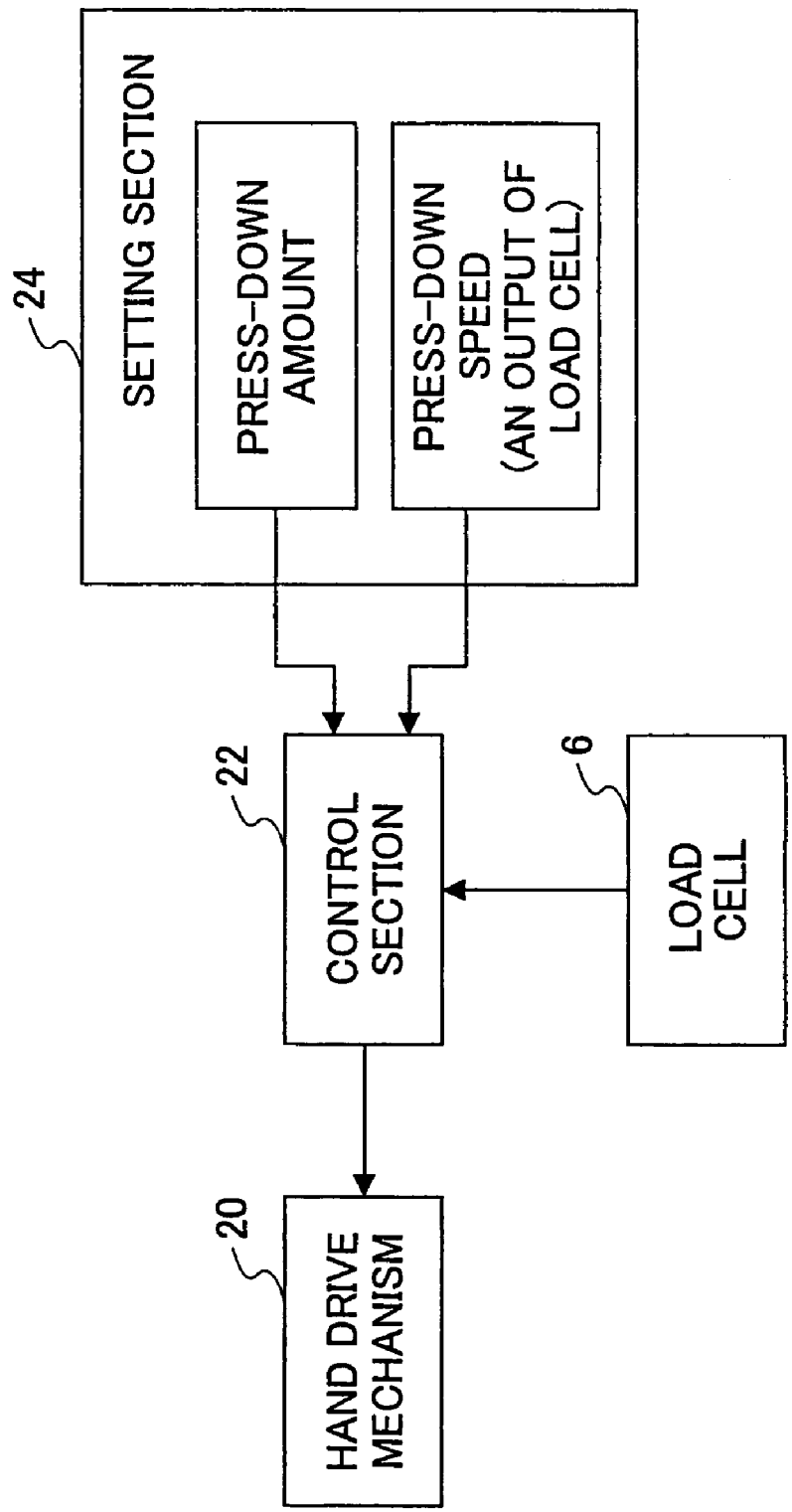
FIG. 4 is a block diagram for control of the hand according to the present invention.

The load cell 6 is provided with a strain gage therein, and a voltage generated by the strain gage as an output is sent to the control section 22 of the hand drive mechanism 20. The impact load at the instant of the contact between the end face of the hand 3 and the IC package 4 and the static load at the time of the subsequent pressing down are sent to the control section 22 as an output of the load cell 6. Therefore, it becomes possible to detect the instantaneous load exerted on the IC package 4. As shown in FIG. 4, the control section 22 stores those outputs in a memory device which is incorporated into the setting section 24 or provided separately from the control section 22. Alternatively, the setting section 24 may be incorporated into the control section 22.

In a calibration mode for determining the reference position of the load cell 6, as shown in FIG. 2, the tray not accommodating the IC package 4 therein is prepared. Then, the hand 3 is lowered to the position where the end face of the hand 3 comes in contact with the tray 5. That position of the hand 3 is determined as the reference position of the hand 3. While maintaining this condition, the position (height) of the load cell 6 is adjusted so that the load cell 6 makes contact with the bottom surface of the base 10. That position of the load cell 6 is determined as the reference position of the load cell 6.

In a transfer mode shown in FIG. 3 for transferring the IC package 4,the reference position is determined for every type of IC package based on the reference position determined in the calibration mode. For example, in case of a thin-type IC package of 1 mm thickness, the position where the hand 3 comes in contact with the thin-type IC package is up 1 mm from the reference position. Likewise, the position of the load cell 6 is adjusted by the servomotor up 1 mm from the reference position determined in the calibration mode and then the load cell 6 is held in that adjusted position.

It becomes possible to perform a measurement of the instantaneous load at all times by setting the IC transfer device in the transfer mode shown in FIG. 3 and by recording a peak value of the measured instantaneous load at every transferring of the IC package 4. In addition to being capable of monitoring the instantaneous load, this IC transfer device is capable of operating with the instantaneous load within load specifications by feeding back the voltage of the strain gage of the load cell 6 to the servomotor of the hand drive mechanism 20 through a cable while continuously monitoring the instantaneous load.

Here, the load specifications define the magnitude of the load by which the chip cracks cannot be produced. Because the magnitude of the instantaneous load that causes the chip cracks (i.e., potentiality of the chip cracks) varies from IC package to IC package, the magnitude of load by which the chip cracks cannot be produced should be previously determined at an evaluation stage. Although it is also possible to use a push-pull gage and the like for this evaluation, the IC transfer device according to the present embodiment can make this evaluation. Specifically, the hand 3 is lowered at the lowering speed of about 20 mm/min under the control of the servomotor, and when the hand 3 comes in contact with the IC package 4, the gage readings of the load cell 6 is taken. This measurement is made for several samples of IC packages while varying the load (e.g., 1 kg for sample 1 and 2 kg for sample 2 and so on). An observation by SAT (Scanning Acoustic Tomograph) is carried out for those samples to determine the critical load.

While the instantaneous load is a combination of the impact load and the static load, it is possible to detect these two types of load in turn. If these two types of load are managed respectively, it becomes possible to control the impact load exerted initially on the IC package 4 by continuously monitoring the gage readings of the load cell 6, as in this embodiment. However, it may be difficult to detect the static load, depending on the output of load cell 6 in a state of high-speed operation of the IC transfer device. But the static load can be detected before the IC package 4 is accommodated in the tray 5. So it is possible to manage the static load as a daily check matter or a routine check matter at a setting of the production lots. Therefore, it is not necessarily required to control the static load during the operation of the IC transfer device.

Furthermore, the static load is the load exerted finally between the end face of the hand 3 and the top surface of the IC package 4. The magnitude of static load by which the chip cracks are produced is significantly large (e.g., 10 kg). On the other hand, the impact load can yield the chip cracks, even if it is one-tenth of the static load (e.g., 1 kg). Accordingly, in terms of the present invention, it is not necessary to manage the static load for every IC package 4 and a periodic check is plenty good enough.

It is also possible to detect the impact load as well as the static load at every transferring of the IC package 4, depending on the way of using the load cell 6. For example, the impact load as well as the static load can be detected, by upsizing the base 10 to which the hand 3 is attached, and by providing two load cells one on each side of the hand 3. In this way, one of the load cells measures the impact load, while the other of the load cells measures the static load by keeping the hand 3 in its lowermost position for a fixed period of time.

Figure 5:
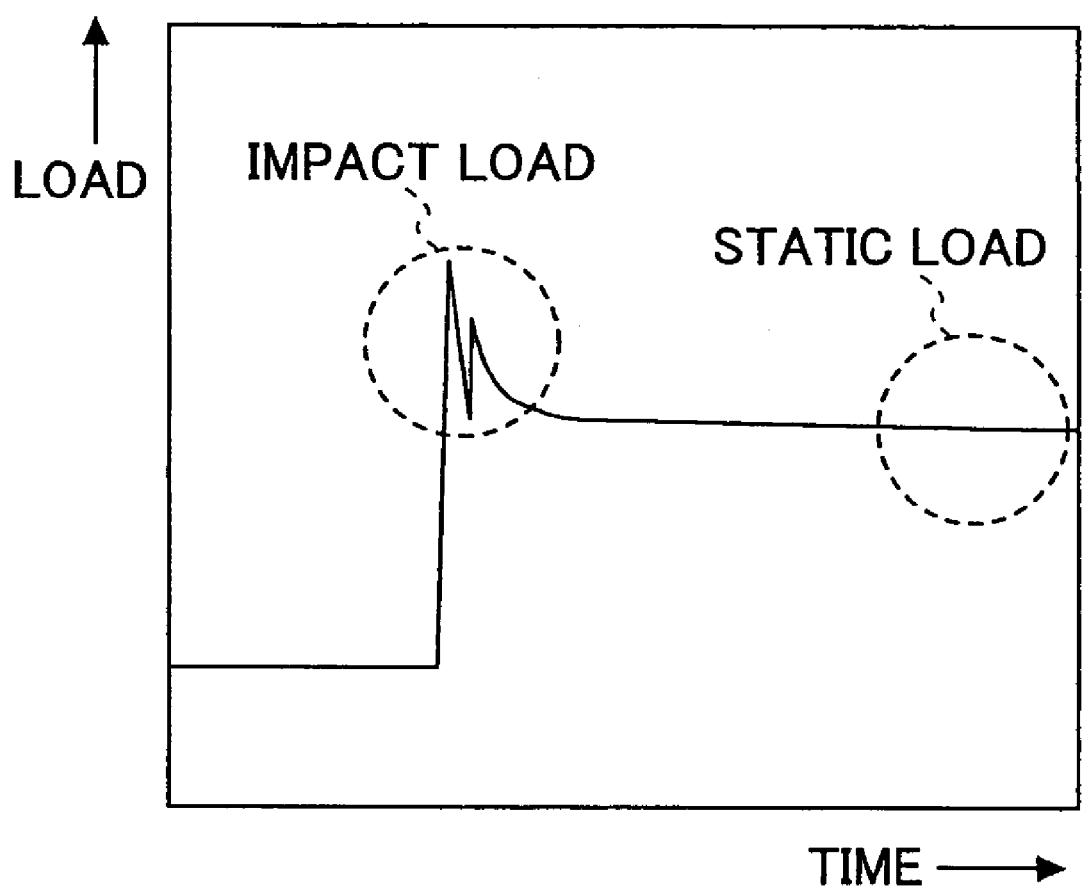
FIG. 5 is a diagram illustrating the instantaneous load.

FIG. 5 shows the instantaneous load (i.e., the impact load and the static load) measured by the load cell 6 of the IC transfer device according to this embodiment. The impact load is generated instantaneously when the hand 3 comes in contact with the IC package and the static load is generated when the hand 3 subsequently applies pressure to the IC package. In actual experiments, the instantaneous load was measured under several conditions. Especially important and advantageous parameters among others are the press-down amount and the press-down speed.

The press-down amount in the neighborhood of 2 mm is traditionally used, however, we set the parameters as follows. The press-down speed at the instance when the hand 3 comes in contact with the IC package 4 was set to seventy percent of the limit of the lowering speed. The press-down amount was set to 0.1 mm, 0.4 mm, 0.7 mm, and 1.0 mm. The result of the measurements is shown in the following Table 1.

TABLE 1

| | Press-down amount (speed = 70%) | | | |
|---|---|---|---|---|
| | 0.1 mm | 0.4 mm | 0.7 mm | 1.0 mm |
| Impact load | 0.43 kgf | 0.78 kgf | 0.95 kgf | 1.39 kgf |
| Static load | 0.29 kgf | 0.32 kgf | 0.47 kgf | 0.74 kgf |

The impact load increased from 0.43 kgf to 1.39 kgf as the press-down amount increased.

Then, the press-down speed was set to 60%, 70%, 80%, and 90% of the limit of the lowering speed, with the press-down amount fixed at 0.4 mm (the press-down amount of 0.4 mm is the limit amount that cannot cause the transferring problems). The result of the measurements is shown in the Table 2 below.

TABLE 2

| | Press-down speed (amount = 4 mm) | | | |
|---|---|---|---|---|
| | 60% | 70% | 80% | 90% |
| Impact load | 0.41 kgf | 0.77 kgf | 0.96 kgf | 1.36 kgf |
| Static load | 0.29 kgf | 0.34 kgf | 0.48 kgf | 0.74 kgf |

In Table 2, the press-down speed is expressed as a percentage of the limit of the lowering speed. Similarly, the load increased as press-down speed increased. In this way, it becomes possible to reduce the impact load by controlling the lowering speed of the hand 3 immediately before making contact with the IC package 4 and thereby the press-down speed of the hand 3. Furthermore, in a state of using the appropriate press-down amount and the press-down speed, it becomes possible to detect irregularities in the chuck operation by continuously monitoring the instantaneous load.

Figure 6:
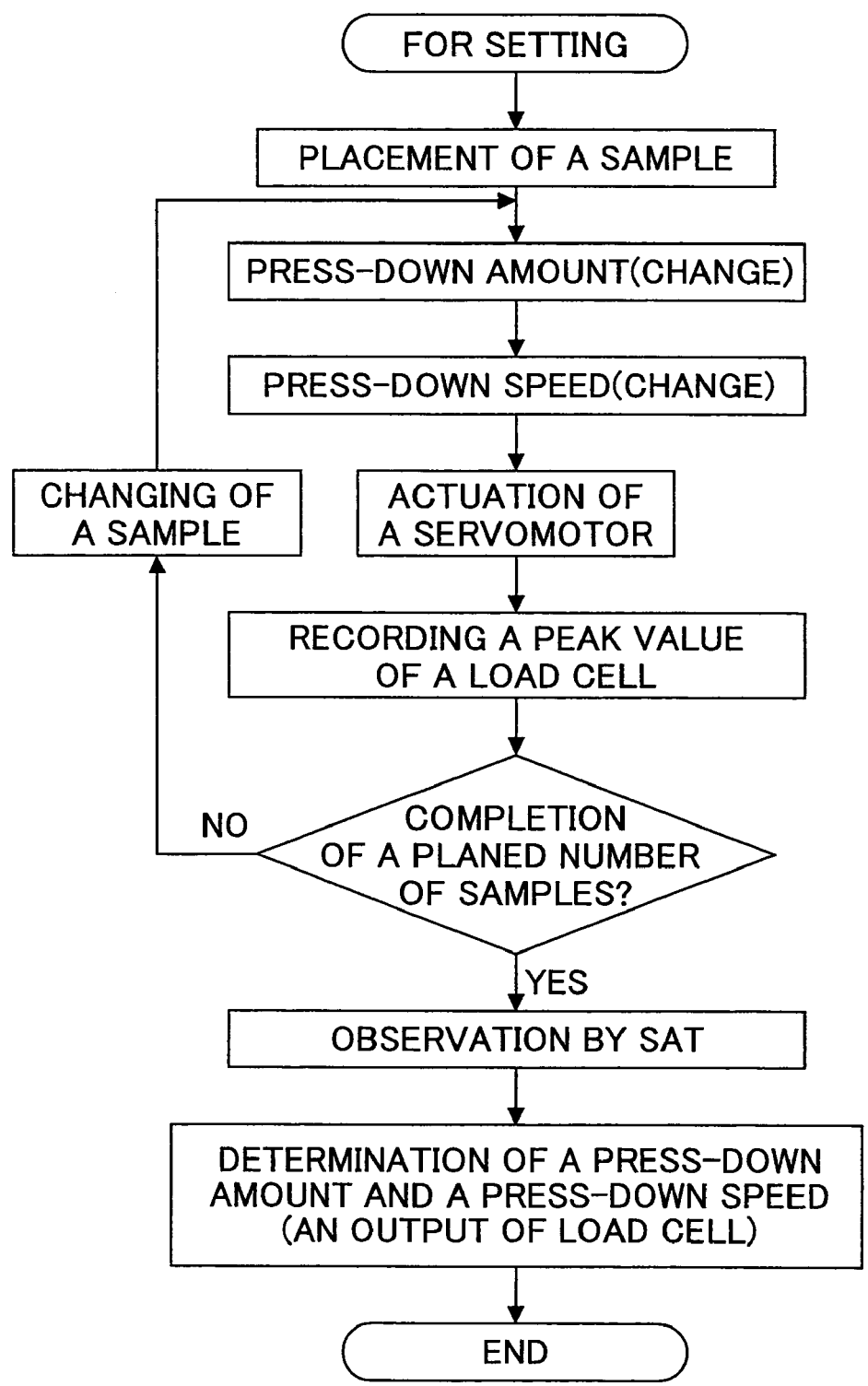
FIG. 6 is a flow chart according to the present invention for showing the sequence of the operation for setting a reference value.

FIG. 6 shows the operation for setting the reference values of a setting section 24 shown in FIG. 4. First of all, an IC package as a sample is placed on the tray 5, and then the sample is chucked by the hand 3 as a result of driving the servomotor of the hand drive mechanism 20 based on the predetermined press-down amount and the press-down speed. At that time, the peak value of the load cell 6 is recorded. This peak value indicates the instantaneous load.

Then, the chuck operation is repeated while changing the samples. At every chuck operation, the setting is changed according to the press-down amount and the press-down speed predetermined for the respective sample. The peak values measured by the load cell 6 at every chuck operation are recorded. After the completion of the operations with predetermined conditions, the observations by SAT for those samples are carried out to determine the optimum value of the press-down amount and the press-down speed as well as the limit value of the instantaneous load based on the samples that have not experienced any cracks. It should be noted that while this embodiment comprises the use of the press-down amount and the press-down speed as the reference values, other types of parameters, such as an output of the load cell (for example, the peak value, or a calculated value of an impact energy), may be used additionally or alternatively as a reference value.

Figure 7:
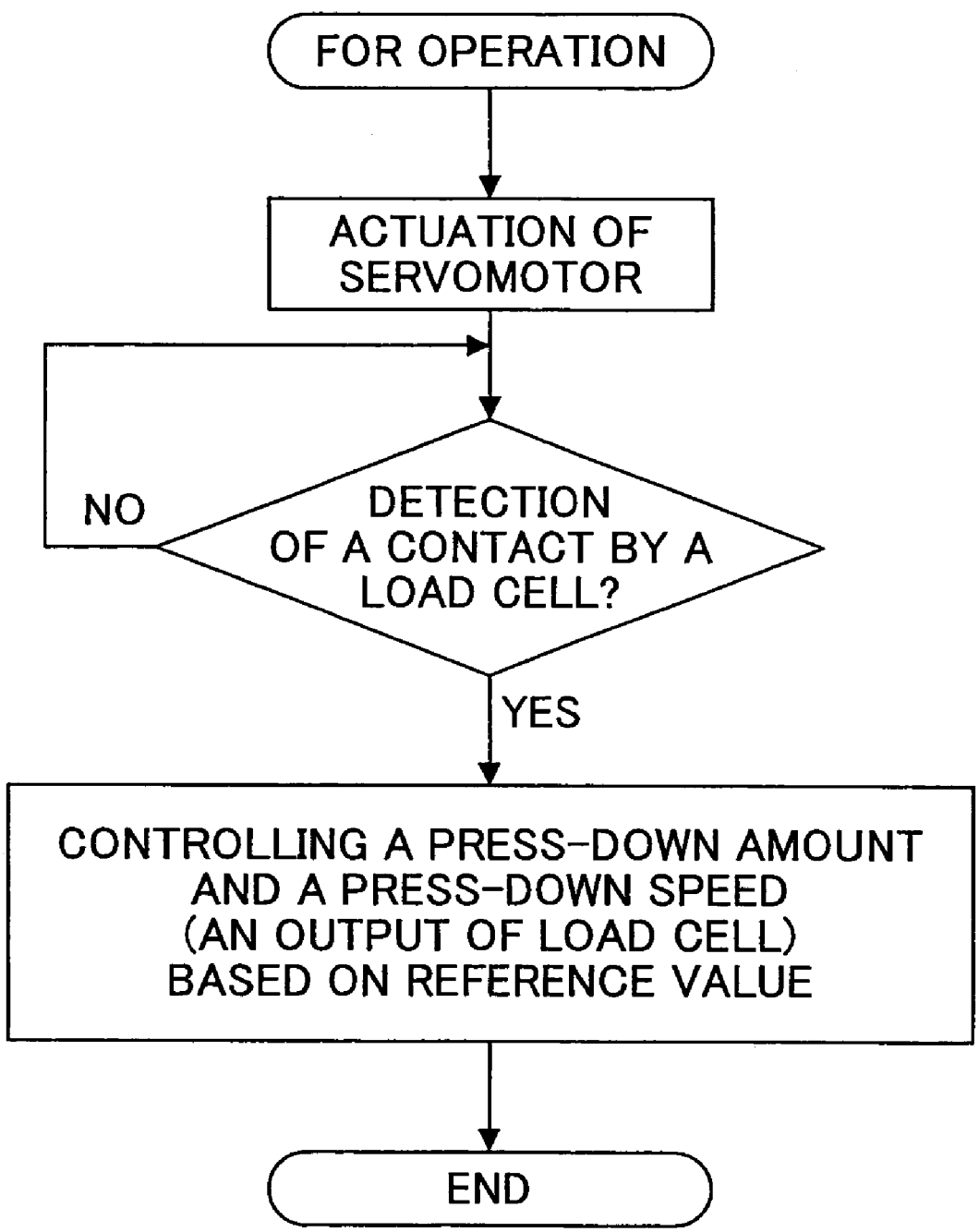
FIG. 7 is a flow chart according to the present invention for showing the operation for transferring the IC package.

FIG. 7 shows the actual operation for transferring the IC package 4 after the completion of the setting of the reference values. Once the operation is initiated and the servomotor is driven, the load is continuously monitored by use of the load cell 6. The control section 22 controls the servomotor of the hand drive mechanism 20 so that the press-down amount and the press-down speed conform to the reference values set in the setting section 24. For example, when the distance from the end face of hand 3 to the IC package 4 becomes a predetermined threshold value (for example, 2 mm), the control section 22 changes the lowering speed of the hand 3 so that the hand 3 comes in contact with the IC package 4 at the speed of the reference value.

In the case of the reference values as to an output of the load cell, when the end face of hand 3 comes in contact with the IC package 4, the control section 22 determines whether a peak value of the load cell 6 exceeds a predetermined threshold value (the reference value set in the setting section 24) or not. This determination enables the detection of the irregularities of the IC transfer device (for example, an error in adjustments or an error due to the environmental factors). After the hand 3 comes in contact with the IC package 4, the control section 22 may controls the servomotor of the hand drive mechanism 20 so that the press-down amount and the output of the load cell 6 conform to the reference values set in the setting section 24.

It should be noted that while this embodiment comprises the use of a servomotor as hand drive mechanism 20, other types of motors such as a pulse motor are equally applicable.

Further, the present invention is not limited to these embodiments, and variations and modifications may be made without departing from the scope of the present invention.

For example, the present invention is not limited to the hand for chucking the IC package on a tray, but is applicable to the hand for handling the IC package when positioning, placing, or connecting the IC package with respect to a target such as a socket. In this case, the pressing down operation as mentioned above is carried out.

By the way, Japanese laid-open patent publication 2001-51018 discloses an IC tester, in which the load cell is made use of to control the load on the IC package. However, in this traditional IC tester, the load cell is made use of to monitor the contact pressure generated when a contactor is pressed against the IC package accommodated in measuring equipment (e.g., a socket) in order to guarantee the electric contact between a terminal of the IC package and a terminal of the socket, thereby stabilizing the electrical characteristic. However, in this traditional IC tester, the instantaneous load at the instance a hand comes in contact with the IC package is not taken into account and only the measurement of the static load is performed. Although the load cell is made use of in the present invention, the present invention differs from these prior art cases especially in the aim and the way of using the load cell.

The invention claimed is:

1. An IC transfer device comprising;
    a hand for chucking an IC package on a tray;
    a hand drive mechanism for moving the hand downward toward the IC package;
    a control section for controlling the hand drive mechanism;
    a load cell which is arranged such as to come in contact with a component integrated with the hand when the hand comes in contact with the IC package, and measures load applied thereto by a lowering operation of the hand; and
    a setting section for setting reference value as to the lowering operation of the hand, wherein,
    the control section is configured to control the hand drive mechanism based on the reference value while monitoring an output of the load cell.

2. The IC transfer device according to claim 1, wherein, the reference value comprises a lowering speed of the hand when the hand comes in contact with the IC package.

3. The IC transfer device according to claim 2, wherein, the control section changes the lowering speed of the hand so that the hand comes in contact with the IC at the speed of the reference value.

4. The IC transfer device according to claim 2, wherein, the reference value further comprises a press-down amount and a press-down speed at the time the hand is further lowered to be pressed down on the IC package after making contact with the IC package.

5. The IC transfer device according to claim 2, wherein, the reference value further comprises a press-down amount and the output of the load cell during the hand is further lowered to be pressed down on the IC package after making contact with the IC package.

6. The IC transfer device according to claim 2, wherein, the reference value as to lowering speed of the hand is less than the lowering speed of the hand before making contact with the IC package.

7. The IC transfer device according to claim 1, wherein, the control section detects irregularities in the lowering operation if a peak value of the output of the load cell exceeds a predetermined threshold value.

8. The IC transfer device according to claim 7, wherein, the predetermined threshold value is determined so as not to cause cracks in the IC package.

9. The IC transfer device according to claim 1, wherein, the hand drive mechanism for moving the hand comprises a servomotor or a step motor.

10. The IC transfer device according to claim 1, wherein, the hand is provided with a mechanism on its end face suitable for holding the IC package.

11. An IC transfer device comprising;
a hand configured such as to hold an IC package;
a hand drive mechanism for moving the hand with the IC package downward toward a target;
a control section for controlling the hand drive mechanism;
a load cell which is arranged such as to come in contact with a component integrated with the hand when the IC package comes in contact with the target, and measures load applied thereto by a lowering operation of the hand; and
a setting section for setting reference values as to the lowering operation of the hand, wherein,
the control section is configured to control the hand drive mechanism based on the reference value while monitoring an output of the load cell.

12. A method of controlling IC transfer device comprising the steps of;
moving a hand downward toward the IC package on a tray;
changing a lowering speed of the hand so that the hand comes in contact with the IC at a predetermined speed;
monitoring an output of a load cell at the time the hand comes in contact with the IC package, said load cell arranged such as to come in contact with a component integrated with the hand when the hand comes in contact with the IC package.

* * * * *